(12) United States Patent
Kadota

(10) Patent No.: US 6,525,345 B1
(45) Date of Patent: Feb. 25, 2003

(54) SEMICONDUCTOR PHOTONIC DEVICE

(75) Inventor: Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/369,656

(22) Filed: Aug. 5, 1999

(30) Foreign Application Priority Data

Aug. 17, 1998 (JP) ............................................ 10-230599

(51) Int. Cl.[7] .............................................. H01L 33/00
(52) U.S. Cl. ............................ 257/94; 257/85; 257/86; 257/103; 438/22; 438/24; 438/46; 438/47
(58) Field of Search .............................. 257/13, 79, 86, 257/85, 103, 94; 438/22, 24, 46, 47, 44; 372/43, 1, 50

(56) References Cited

U.S. PATENT DOCUMENTS

| | | | |
|---|---|---|---|
| 5,719,538 A | * | 2/1998 | Kadota ........................ 333/193 |
| 5,751,013 A | * | 5/1998 | Kidoguchi et al. ............ 257/13 |
| 5,990,495 A | * | 11/1999 | Ohba ............................ 257/94 |
| 6,033,490 A | * | 3/2000 | Kimura et al. ............. 148/33.4 |
| 6,169,294 B1 | * | 1/2001 | Biing-Jye et al. ............. 257/79 |

FOREIGN PATENT DOCUMENTS

| | | | |
|---|---|---|---|
| DE | 19648955 | | 5/1997 |
| EP | 0607435 | | 8/1992 |
| JP | 3-290981 A | * | 12/1991 |
| JP | 08032113 | | 2/1996 |
| JP | 09237167 | | 9/1997 |
| JP | 10-173228 A | * | 6/1998 |
| JP | 10173228 | | 6/1998 |
| JP | 10186423 | | 7/1998 |
| JP | 11-79897 A | * | 3/1999 |

OTHER PUBLICATIONS

M.Wraback et al, Appli. Phys. Lett., vol. 74, No. 4, pp507–509, Jan. 25, 1999.*

* cited by examiner

Primary Examiner—Steven Leke
Assistant Examiner—Donghee Kang
(74) Attorney, Agent, or Firm—Keating & Bennett, LLP

(57) ABSTRACT

A semiconductor photonic device includes a Z-cut quartz substrate and a compound semiconductor layer presented by $In_xGa_yAl_zN$ (where $x+y+z=1$, $0 \leq x \leq 1$, $0 \leq y \leq 1$, and $0 \leq z \leq 1$) formed on the Z-cut quartz substrate.

9 Claims, 5 Drawing Sheets

SEMICONDUCTOR PHOTONIC DEVICE

BACKGROUND OF THE INVENTION

1. Field of the Invention

The present invention relates to a semiconductor photonic device, and more particularly to semiconductor photonic devices using III–V compounds such as GaN, InGaN, GaAlN, and InGaAlN.

2. Description of the Related Art

As materials for semiconductor photonic devices such as light emitting diodes (LEDs) and laser diodes (LDs) which emit blue light or ultraviolet light, or photo diodes which detect blue light or ultraviolet light, III–V compound semiconductors represented by the general formula $In_xGa_yAl_zN$ (where $x+y+z=1$, $0 \leq x \leq 1$, $0 \leq y \leq 1$, and $0 \leq z \leq 1$) are known. The compound semiconductors have high light emission efficiency because they are of the direct transition type, and emission wavelengths can be controlled by the indium content, and thus these compound semiconductors have been regarded as promising materials for light emitting devices.

Since it is difficult to form a large single crystal of the $In_xGa_yAl_zN$, in order to form a crystal film thereof, a so-called "hetero-epitaxial growth method" is used, in which a crystal film is grown on a substrate of a different material, and generally, it is grown on a C-plane sapphire substrate. However, C-plane sapphire substrates are expensive, and moreover, because of large lattice mismatching, many crystal defects at dislocation densities of $10^8/cm^2$ to $10^{11}/cm^2$ occur in grown crystals, and thus it is not possible to obtain quality crystal films having excellent crystallinity, which is a problem.

Consequently, in order to reduce lattice mismatching when $In_xGa_yAl_zN$ is grown on a C-plane sapphire substrate and to obtain crystals having few defects, a method has been disclosed in which a polycrystalline or amorphous AlN buffer layer or a low temperature growth GaN buffer layer is provided on a C-plane sapphire substrate. For example, hexagonal GaN has a lattice constant in the a-axis direction (hereinafter referred to as "lattice constant a") of 3.189 Å, and AlN has a lattice constant a of 3.1113 Å which is close to that of GaN. In accordance with the above method, since lattice mismatching between the C-plane sapphire substrate and the buffer layer is reduced and at the same time lattice mismatching between the buffer layer and $In_xGa_yAl_zN$ is reduced, a crystal film having few defects can be obtained. However, in this method, in addition to the expensive sapphire substrate, the structure becomes complex, resulting in a further increase in cost.

Additionally, an SiC substrate which has small lattice mismatching has been investigated. However, SiC substrates are much more expensive in comparison with C-plane sapphire substrates (approximately 10 times as costly as C-plane substrates), which is disadvantageous.

SUMMARY OF THE INVENTION

The present invention can solve the aforementioned technical problems associated with the conventional devices, provide a semiconductor photonic device having a high quality $In_xGa_yAl_zN$ thin film on an inexpensive quartz substrate.

The semiconductor photonic device comprises: a Z-cut quartz substrate; and a compound semiconductor layer represented by $In_xGa_yAl_zN$ (where $x+y+z=1$, $0 \leq x \leq 1$, $0 \leq y \leq 1$, and $0 \leq z \leq 1$) and formed on the Z-cut quartz substrate. It is preferable that the [1000] direction, the [10$\bar{1}$0] direction, and the [11$\bar{2}$0] direction of the $In_xGa_yAl_zN$ layer substantially correspond to the [1000] direction, the [10$\bar{1}$0] direction, and the [11$\bar{2}$0] direction of the quartz substrate, respectively. In addition, The semiconductor photonic device may further comprises a ZnO thin film or AlN thin film between the compound semiconductor layer and the Z-cut quartz substrate.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

In a semiconductor photonic device using a compound semiconductor represented by $In_xGa_yAl_zN$ (where $x+y+z=1$, $0 \leq x \leq 1$, $0 \leq y \leq 1$, and $0 \leq z \leq 1$) in accordance with the present invention, an $In_xGa_yAl_zN$ layer is formed on a Z-cut quartz substrate.

A ratio between the lattice constant a of a quartz substrate with respect to the [1000] direction and the lattice constant a of $In_xGa_yAl_zN$ with respect to the [1000] direction (i.e., a ratio between lattice constants a with respect to the individual [1000] directions) and a ratio between the distance of the (10$\bar{1}$0) plane of the quartz substrate and the distance of the (10$\bar{1}$0) plane of the $In_xGa_yAl_zN$ (i.e., a ratio between distances of the (10$\bar{1}$0) plane with respect to the individual [10$\bar{1}$0] directions) are substantially the same integral ratio. Thus, when an $In_xGa_yAl_zN$ layer is formed on a Z-cut quartz substrate, the $In_xGa_yAl_zN$ layer can be oriented in the c-axis direction and a quality $In_xGa_yAl_zN$ layer having small lattice mismatching can be obtained.

By using a Z-cut quartz substrate, an $In_xGa_yAl_zN$ layer can be formed on an inexpensive quartz substrate, and semiconductor photonic devices such as light emitting diodes and laser diodes which emit blue light or ultraviolet light can be fabricated at low cost.

In a semiconductor photonic device using a compound semiconductor represented by $In_xGa_yAl_zN$ (where $x+y+z=1$, $0 \leq x \leq 1$, $0 \leq y \leq 1$, and $0 \leq z \leq 1$) in accordance with the present invention, a ZnO thin film or AlN thin film is formed on a Z-cut quartz substrate, and an $In_xGa_yAl_zN$ layer is formed on the thin film.

In such a semiconductor photonic device, since the ZnO thin film or AlN thin film is formed as a buffer layer on the Z-cut quartz substrate, lattice mismatching of the $In_xGa_yAl_zN$ formed thereon can be further reduced. Thus, higher quality semiconductor photonic devices such as light emitting diodes and laser diodes which emit blue light or ultraviolet light can be fabricated.

Embodiment 1

Figure 1:
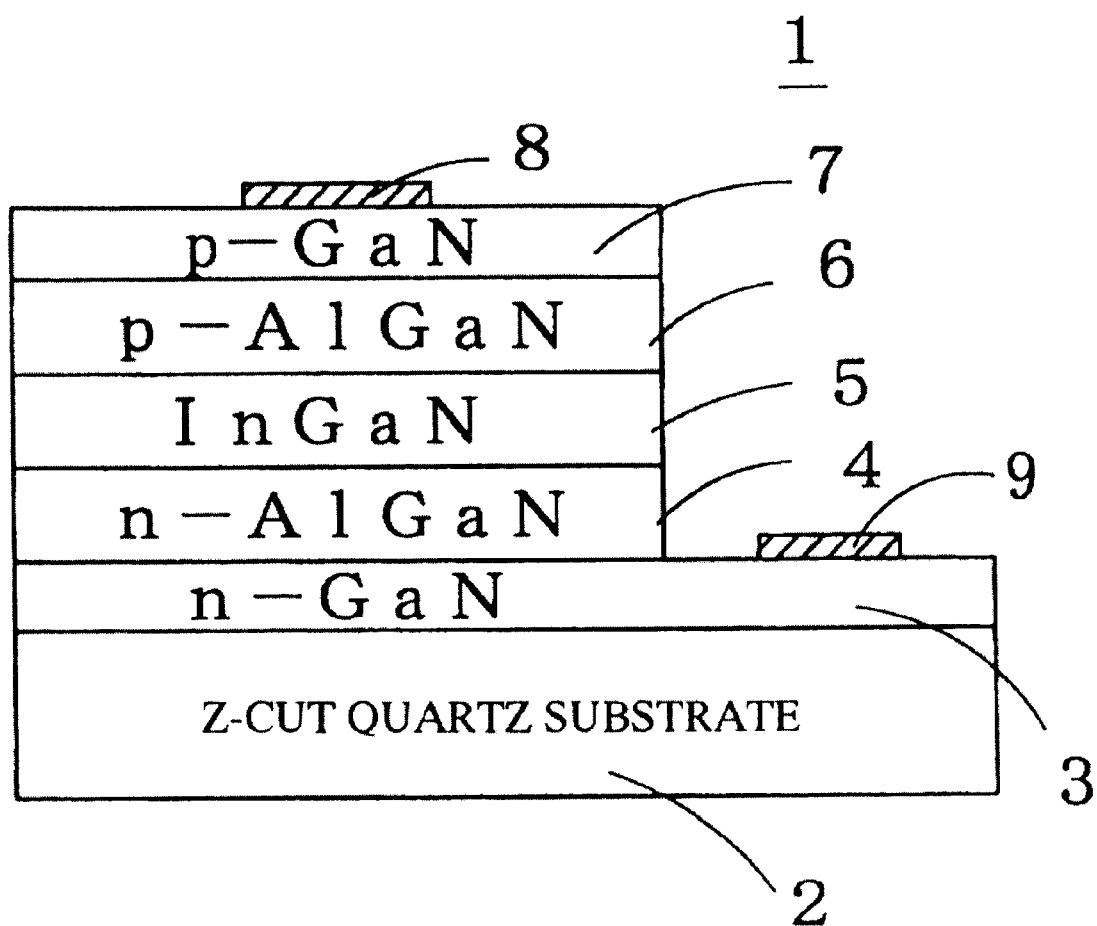
FIG. 1 is a sectional view of a semiconductor photonic device as an embodiment of the present invention.

FIG. 1 shows a semiconductor photonic device 1 as an embodiment of the present invention, such as a light emitting diode or a surface light emitting laser diode, in which an InGaN layer 5 functions as a luminescent layer. In the semiconductor photonic device 1, a hexagonal n-GaN thin film 3 is formed on a Z-cut quartz substrate 2, and an n-AlGaN layer 4, an InGaN layer 5, a p-AlGaN layer 6, and a p-GaN layer 7 are deposited in that order on the n-GaN layer 3. By etching the n-AlGaN layer 4, the InGaN layer 5, the p-AlGaN layer 6, and the p-GaN layer 7, the n-GaN layer 3 is partially exposed. An upper electrode 8 is provided on the p-GaN layer 7 and a lower electrode 9 is formed on the n-GaN layer 3. Accordingly, when a direct voltage is applied between the upper electrode 8 provided on the p-GaN layer 7 and the lower electrode 9 provided on the n-GaN layer 3, an electric current flows between the upper electrode 8 and the lower electrode 9. The electric current is injected into the InGaN layer 5 from the upper electrode 8 to emit light, and the light emitted from the InGaN layer 5 is emitted to the exterior from the region in which the upper electrode 8 is not provided on the upper surface of the p-GaN layer 7.

Figure 2A:
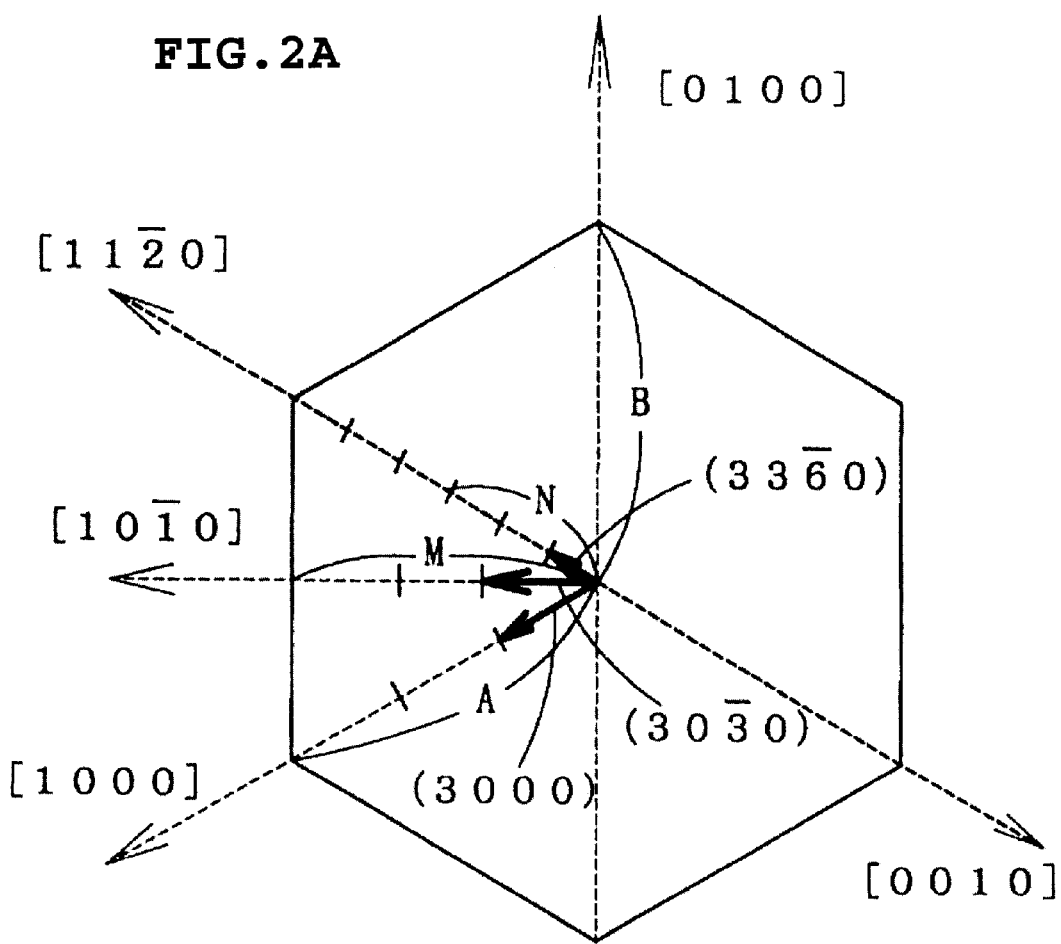
FIG. 2A is a diagram which shows a unit cell of a Z-cut quartz substrate.
Figure 2B:
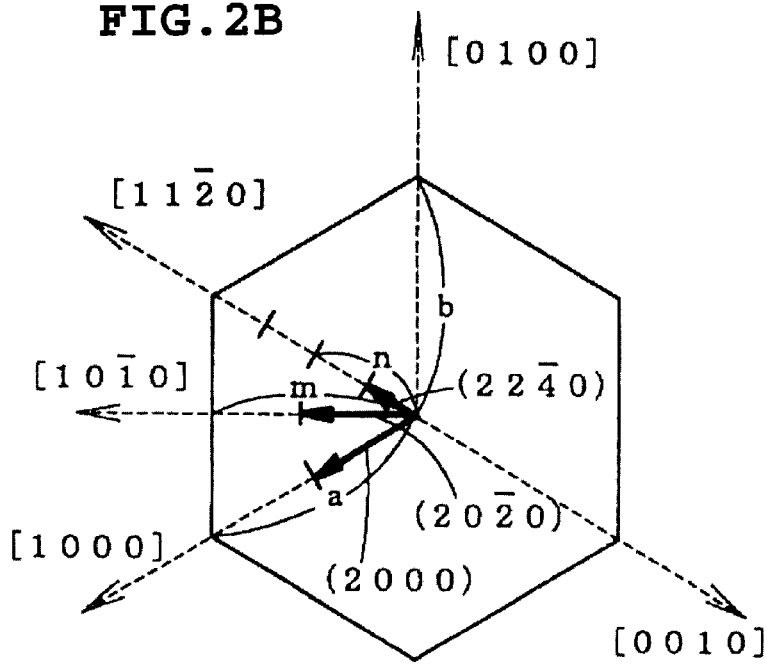
FIG. 2B is a diagram which shows a unit cell of GaN.

Lattice constants and lattice spacing with respect to a Z-cut quartz substrate and GaN will next be described. As shown in FIG. 2B, in a hexagonal GaN thin film, with respect to a lattice constant a in the [1000] direction and a lattice constant b (lattice constant in the b-axis direction) in the [0100] direction, a=b=3.1860 Å. With respect to a length m in the [10$\bar{1}$0] direction and a length n in the [11$\bar{2}$0] direction, m=2.7592 Å and n=1.5930 Å. Since trigonal quartz has a 6-fold rotation axis, the same as the hexagonal system, it is shown similarly to the hexagonal system in FIG. 2A, and the same orientation is assumed as in the hexagonal system. In a Z-cut quartz substrate, with respect to a lattice constant A (lattice constant in the a-axis direction) in the [1000] direction and a lattice constant B (lattice constant in the b-axis direction) in the [0100] direction, A=B=4.9131 Å. With respect to a length M in the [10$\bar{1}$0] direction and a length N in the [11$\bar{2}$0] direction, M=4.2549 Å and N=2.4566 Å. Therefore, in the [1000] direction and the [0100] direction, the ratio of the lattice constant A of the Z-cut quartz substrate to the lattice constant a of GaN is represented by A:a and is substantially equal to 3:2 (small integral ratio), and with respect to the distance of the ($\bar{1}$0) plane and the distance of the (11$\bar{2}$0) plane, the ratio of the lattice constant B of the Z-cut quartz substrate to the lattice constant b of GaN is represented by B:b and is also substantially equal to 3:2. In other words, the distance of the (2000) plane (the length of the arrow: a/2) in the hexagonal GaN thin film is 1.5930 Å, which is substantially equal to the distance of the (3000) plane (the length of the arrow: A/3) in the Z-cut quartz substrate 2 of 1.6377 Å. Similarly, the distance of the (2020) plane (the length of the arrow: m/2) in the hexagonal GaN thin film is 1.3795 Å, which is substantially equal to the distance of (3030) plane (the length of the arrow: M/3) in the Z-cut quartz substrate 2 of 1.4183 Å. The distance of the (2240) plane (the length of the arrow: n/2) in GaN is 0.7965 Å, which is substantially equal to the distance of the (3360) plane (the length of the arrow: N/3) in Z-cut quartz of 0.8189 Å. Therefore, the distance of the (3000) plane in the Z-cut quartz substrate agrees with the distance of the (2000) plane in the GaN thin film with an error of 3% or less. The distance of the (3030) plane in the Z-cut quartz substrate agrees with the distance of the (2020) plane in the GaN thin film with an error of 3% or less. The distance of the (2240) plane in GaN agrees with the distance of the (3360) plane in the Z-cut quartz substrate) with an error of 3% or less.

Figure 3:
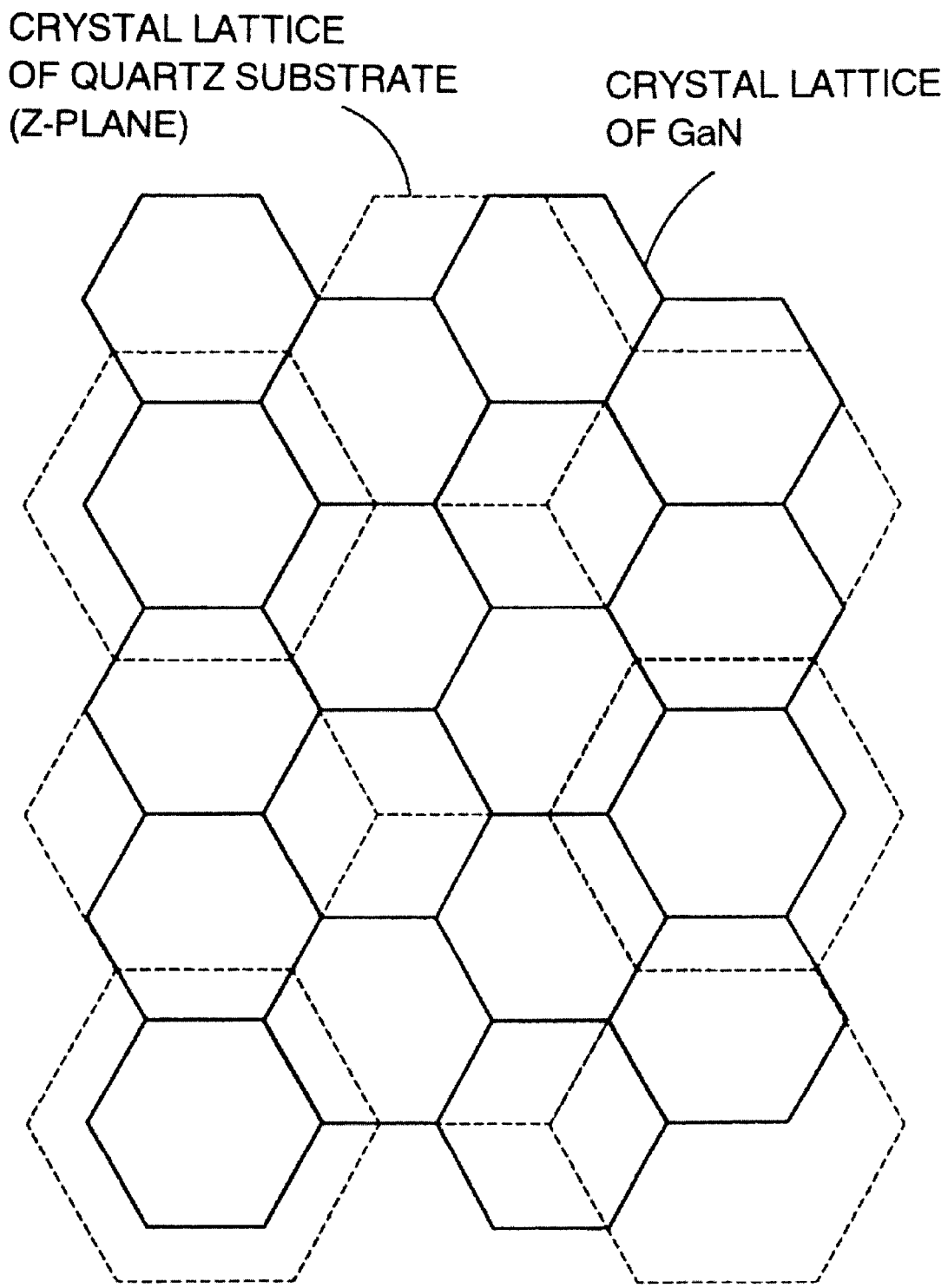
FIG. 3 is a diagram which shows the crystal structure of GaN grown on a Z-cut quartz substrate.

Therefore, by growing a hexagonal GaN thin film oriented in the c-axis direction on the Z-plane of the Z-cut quartz substrate 2, an n-GaN layer 3 having good crystallinity can be obtained as shown in FIG. 3. By growing an n-AlGaN layer 4, an InGaN layer 5, a p-AlGaN layer 6, and a p-GaN layer 7 on the n-GaN layer 3, a semiconductor photonic device 1 such as a blue diode or an ultraviolet diode can be fabricated using an inexpensive quartz substrate 2.

Embodiment 2

Figure 4:
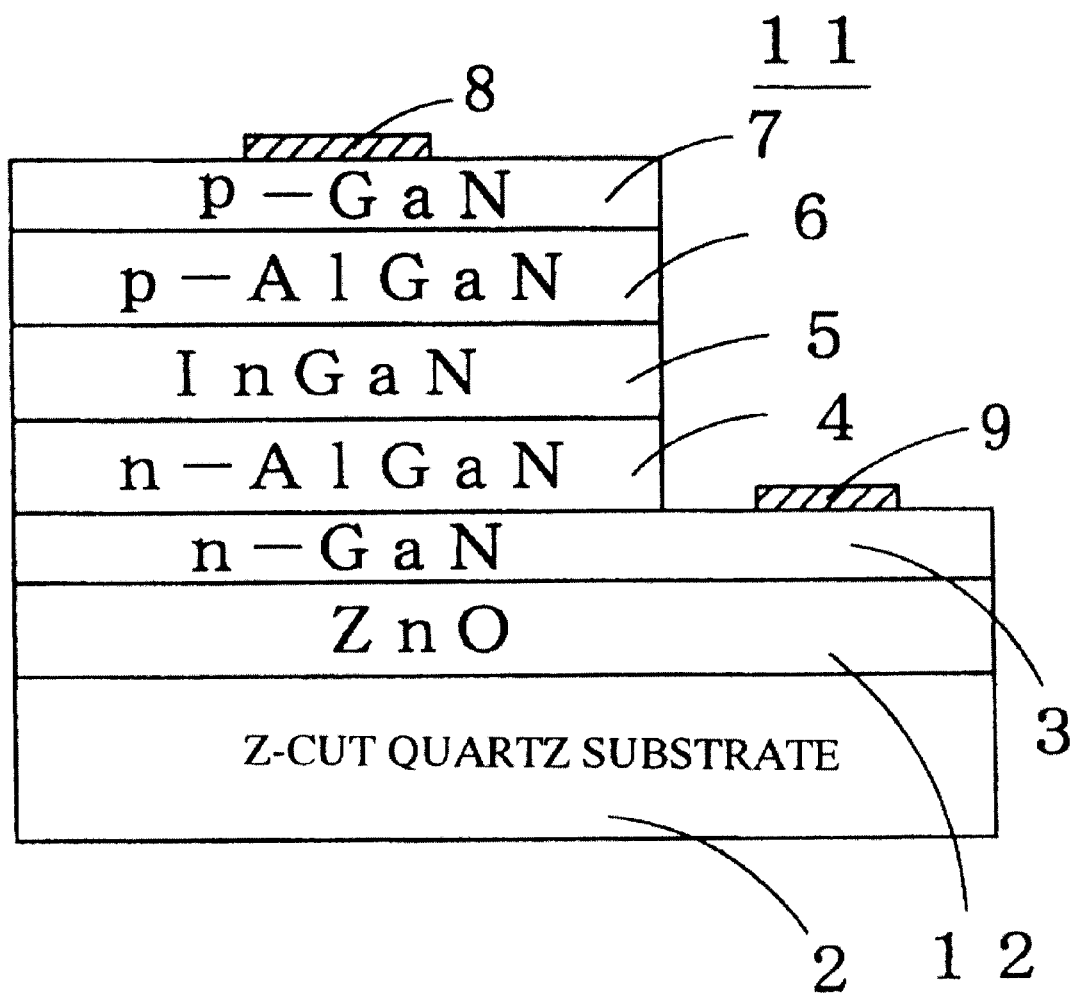
FIG. 4 is a sectional view of a semiconductor photonic device as another embodiment of the present invention.

FIG. 4 is a sectional view of a semiconductor photonic device 11 as another embodiment of the present invention. In the semiconductor photonic device 11, a ZnO film 12 is formed on a Z-cut quartz substrate 2, and an n-GaN layer 3, an n-AlGaN layer 4, an InGaN layer 5, a p-AlGaN layer 6, and a p-GaN layer 7 are deposited in that order on the ZnO film 12. By etching the n-AlGaN layer 4, the InGaN layer 5, the p-AlGaN layer 6, and the p-GaN layer 7, the n-GaN layer 3 is partially exposed. An upper electrode 8 is provided on the p-GaN layer 7, and a lower electrode 9 is formed on the upper surface of the n-GaN layer 3. (Alternatively, the resistance of the ZnO film 12 may be reduced by doping impurities, and the lower electrode 9 may be formed on the ZnO film 12.) Since the hexagonal ZnO film 12 has a lattice constant a of 3.24265 Å, which is close to the lattice constant of GaN (3.186 Å), by forming the ZnO film 12 as a buffer layer on the Z-cut quartz substrate 2, a better n-GaN layer 3 can be formed, and thus a better light emitting device 11 such as a blue or ultraviolet diode can be fabricated.

Embodiment 3

Figure 5:
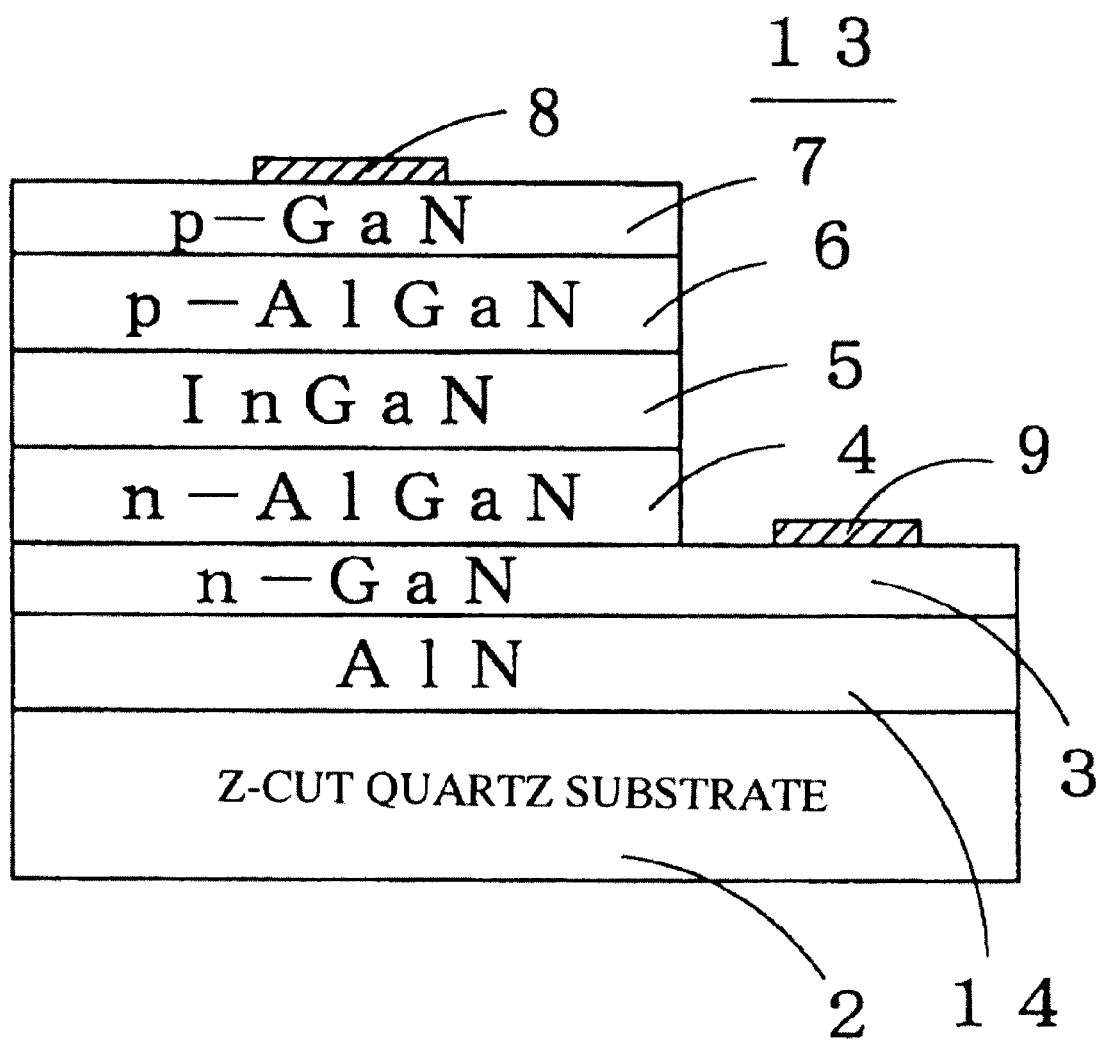
FIG. 5 is a sectional view of a semiconductor photonic device as still another embodiment of the present invention.

FIG. 5 is a sectional view of a semiconductor photonic device 13 as still another embodiment of the present invention. In the semiconductor photonic device 13, an AlN film 14 is formed on a Z-cut quartz substrate 2, and an n-GaN layer 3, an n-AlGaN layer 4, an InGaN layer 5, a p-AlGaN layer 6, a p-GaN layer 7 are deposited in that order on the AlN film 14. By etching the n-AlGaN layer 4, the InGaN layer 5, the p-AlGaN layer 6, and the p-GaN layer 7, the n-GaN layer 3 is partially exposed. An upper electrode 8 is provided on the upper surface of the p-GaN layer 7 and a lower electrode 9 is formed on the upper surface of the n-GaN layer 3. (Alternatively, the resistance of the AlN film 14 may be reduced by doping impurities, and the lower electrode 9 may be formed on the AlN film 14.)

Since the AlN film 14 has a lattice constant of 3.1113 Å, which is close to the lattice constant of GaN (3.186 Å), by forming the AlN film 14 as a buffer layer on the Z-cut quartz substrate 2, a better n-GaN layer 3 can be formed, and thus a better light emitting device 13 such as a blue or ultraviolet diode can be fabricated.

Although surface light emitting type devices are shown as embodiments described above, of course, the present invention may be applicable to a laser diode or a facet emitting type light emitting diode.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A semiconductor photonic device comprising:
   a Z-cut quartz substrate; and
   a compound semiconductor layer represented by $In_xGa_yAl_zN$ (where x+y+z=1, $0 \leq x \leq 1$, $0 \leq y \leq 1$, and $0 \leq z \leq 1$) formed on the Z-cut quartz substrate.

2. A semiconductor photonic device according to claim 1, wherein the [1000] direction, the [10$\bar{1}$0] direction, and the [11$\bar{2}$0] direction of the $In_xGa_yAl_zN$ layer substantially correspond to the [1000] direction, the [10$\bar{1}$0] direction, and the [11$\bar{2}$0] direction of the quartz substrate, respectively.

3. A semiconductor photonic device comprising:
   a Z-cut quartz substrate;
   a thin film buffer layer of GaN, ZnO or AlN formed on the Z-cut quartz substrate; and
   a compound semiconductor layer represented by $In_xGa_yAl_zN$ (where x+y+z=1, $0 \leq x \leq 1$, $0 \leq y \leq 1$, and $0 < z \leq 1$), formed on the ZnO thin film or AlN thin film.

4. A semiconductor photonic device according to claim 3, wherein the buffer layer is GaN.

5. A semiconductor photonic device according to claim 3, wherein the buffer layer is ZnO.

6. A semiconductor photonic device according to claim 3, wherein the buffer is AlN.

7. A photonic device comprising:
   a Z-cut quartz substrate;
   an n-GaN thin film on the Z-cut quartz substrate;
   an n-AlGaN layer on the n-GaN thin film;
   an InGaN layer on the n-AlGaN layer;
   a p-AlGaN layer on the InGaN layer;
   a p-GaN layer on the p-AlGaN layer;
   a first electrode on the p-GaN layer; and
   a second electrode on the n-GaN layer.

8. A photonic device comprising:
   a Z-cut quartz substrate;
   a ZnO film on the Z-cut quartz substrate;
   an n-GaN layer on the ZnO film;
   an n-AlGaN layer on the n-GaN layer;
   an InGaN layer on the n-AlGaN layer;
   a p-AlGaN layer on the InGaN layer;
   a p-GaN layer on the p-AlGaN layer;
   a first electrode on the p-GaN layer; and
   a second electrode on the n-GaN layer.

9. A photonic device comprising:
   a Z-cut quartz substrate;
   an AlN film on the Z-cut quartz substrate;
   an n-GaN layer on the AlN film;
   an n-AlGaN layer on the n-GaN layer;
   an InGaN layer on the n-GaN layer;
   a p-AlGaN layer on the n-AlGaN layer;
   a p-GaN layer on the p-AlGaN layer;
   a first electrode on the p-GaN layer; and
   a second electrode on the n-GaN layer.

* * * * *